(12) United States Patent
Takagi et al.

(10) Patent No.: US 10,237,971 B2
(45) Date of Patent: Mar. 19, 2019

(54) WIRING BOARD ASSEMBLY AND METHOD FOR PRODUCING SAME

(71) Applicant: FUJIKURA LTD., Tokyo (JP)

(72) Inventors: Ryotaro Takagi, Sakura (JP); Kosuke Shimozuru, Sakura (JP); Yuji Inatani, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/914,987

(22) PCT Filed: Sep. 30, 2014

(86) PCT No.: PCT/JP2014/076052
§ 371 (c)(1),
(2) Date: Feb. 26, 2016

(87) PCT Pub. No.: WO2015/050111
PCT Pub. Date: Apr. 9, 2015

(65) Prior Publication Data
US 2016/0205765 A1    Jul. 14, 2016

(30) Foreign Application Priority Data

Oct. 1, 2013 (JP) .................................. 2013-206501
Mar. 20, 2014 (JP) .................................. 2014-058224

(51) Int. Cl.
*H05K 1/02*     (2006.01)
*H05K 1/11*     (2006.01)
(Continued)

(52) U.S. Cl.
CPC ........... *H05K 1/028* (2013.01); *H05K 1/0215* (2013.01); *H05K 1/0281* (2013.01);
(Continued)

(58) Field of Classification Search
CPC .... H05K 1/028; H05K 3/0061; H05K 1/0298; H05K 1/115; H05K 1/0215;
(Continued)

(56) References Cited

U.S. PATENT DOCUMENTS 4,312,897 A * 1/1982 Reimann .............. H05K 1/0265
                                                                205/125
4,804,615 A * 2/1989 Larson .................. H05K 3/243
                                                                205/126
(Continued)

FOREIGN PATENT DOCUMENTS

CN       1792125 A     6/2006
CN       101262735 A   9/2008
(Continued)

OTHER PUBLICATIONS

Japanese Office Action for JP Application No. 2014-058224 dated Oct. 6, 2014.
(Continued)

*Primary Examiner* — Ishwarbhai B Patel
(74) *Attorney, Agent, or Firm* — Osha Liang LLP

(57) ABSTRACT

A wiring board assembly (1) includes: a flexible printed wiring board (2) which includes at least an insulating substrate (5) including a through-hole (53), and wiring patterns (61) and (62) provided on the insulating substrate (5) and extending to peripheral edge portions (531*n*) and (532*n*) of the through-hole (53); a metal reinforcing plate (3) attached to the flexible printed wiring board (2) and facing the through-hole (53); and a solder connection portion (4) covering an inner wall surface (534) of the through-hole (53) and electrically connecting the wiring patterns (61) and (62) to the metal reinforcing plate (3).

6 Claims, 10 Drawing Sheets

(51) Int. Cl.
*H05K 3/00* (2006.01)
*H05K 1/03* (2006.01)

(52) U.S. Cl.
CPC ........... *H05K 1/0298* (2013.01); *H05K 1/115* (2013.01); *H05K 3/0061* (2013.01); *H05K 1/0393* (2013.01); *H05K 1/118* (2013.01); *H05K 2201/0305* (2013.01); *H05K 2201/09063* (2013.01); *H05K 2201/09554* (2013.01); *H05K 2201/09627* (2013.01); *H05K 2203/043* (2013.01); *H05K 2203/1178* (2013.01); *H05K 2203/167* (2013.01)

(58) Field of Classification Search
CPC ..... H05K 2203/043; H05K 2203/1178; H05K 2201/09627; H05K 2201/09554; H05K 1/0393; H05K 2201/09063; H05K 2203/167; H05K 2201/0305
See application file for complete search history.

(56) References Cited

U.S. PATENT DOCUMENTS

| | | | | |
|---|---|---|---|---|
| 5,863,406 A | * | 1/1999 | Mazzoni | H05K 3/3473 205/126 |
| 5,914,859 A | | 6/1999 | Takada et al. | |
| 6,217,987 B1 | | 4/2001 | Ono et al. | |
| 6,421,253 B1 | * | 7/2002 | Ash, Jr. | H05K 1/021 29/831 |
| 6,459,044 B2 | * | 10/2002 | Watanabe | B32B 3/00 174/254 |
| 6,740,824 B2 | * | 5/2004 | Poglitsch | H01R 13/58 174/254 |
| 6,838,623 B2 | * | 1/2005 | Kneisel | H05K 3/445 174/255 |
| 6,954,987 B2 | * | 10/2005 | Wong | H05K 3/341 29/830 |
| 7,304,247 B2 | * | 12/2007 | Birgel | H05K 1/114 174/254 |
| 8,138,428 B2 | * | 3/2012 | Maeda | H01L 23/10 174/255 |
| 2002/0009578 A1 | | 1/2002 | Watanabe et al. | |
| 2002/0127772 A1 | * | 9/2002 | Lin | H01L 24/02 438/108 |
| 2004/0231884 A1 | | 11/2004 | Wong et al. | |
| 2005/0173151 A1 | | 8/2005 | Shepherd et al. | |
| 2005/0263324 A1 | | 12/2005 | Wong et al. | |
| 2008/0173472 A1 | * | 7/2008 | Takizawa | H05K 1/116 174/260 |
| 2010/0094607 A1 | | 4/2010 | Shepherd et al. | |
| 2013/0221075 A1 | | 8/2013 | Shepherd et al. | |

FOREIGN PATENT DOCUMENTS

| | | |
|---|---|---|
| JP | 1-73959 U | 5/1989 |
| JP | 3-79465 U | 8/1991 |
| JP | 4-30491 A | 2/1992 |
| JP | 10-22589 A | 1/1998 |
| JP | 2005-302854 A | 10/2005 |
| JP | 2007-189091 A | 7/2007 |
| JP | 2009-218443 A | 9/2009 |

OTHER PUBLICATIONS

International Search Reportt for PCT/JP2014/076052 dated Nov. 11, 2014. [PCT/ISA/210].
Office Action issued in corresponding Chinese Application No. 201480047948.0 dated Sep. 29, 2017 (7 pages).
Office Action issued in corresponding Korean Application No. 2016-7011365 dated Sep. 29, 2017 (4 pages).
Office Action issued in corresponding Korean Application No. 10-2016-7011365 dated Apr. 25, 2018 (5 pages).

\* cited by examiner

WIRING BOARD ASSEMBLY AND METHOD FOR PRODUCING SAME

CROSS REFERENCE TO RELATED APPLICATIONS

This application is a National Stage of International Application No. PCT/JP2014/076052 filed Sep. 30, 2014, claiming priority based on Japanese Patent Application Nos. 2013-206501 filed Oct. 1, 2013 and 2014-058224 filed Mar. 20, 2014, the contents of all of which are incorporated herein by reference in their entirety.

TECHNICAL FIELD

The present invention relates to a wiring board assembly provided with a flexible printed wiring board and a metal reinforcing plate, and a method for producing the same.

BACKGROUND ART

A technique for producing a circuit board having an electromagnetic shielding effect by attaching a metal reinforcing plate to the body of the circuit board using an isotropic conductive bonding sheet is known (for example, refer to Patent Document 1).

In addition, regarding the technique, a technique for connecting a ground circuit to a metal reinforcing plate using two types of conductive adhesives including a highly conductive adhesive and an adhesive having high adhesion properties prepared by changing the density of conductive particles is disclosed (for example, refer to Patent Document 2).

CITATION LIST

Patent Document

Patent Document 1: JP 2007-189091 A
Patent Document 2: JP 2009-218443 A

SUMMARY OF THE INVENTION

Problem to be Solved by the Invention

In the circuit board disclosed in Patent Document 1, since a process or the like for removing bubbles from stepped portions of circuits during lamination of the isotropic conductive bonding sheet is necessary, there is a problem in that productivity is deteriorated.

In addition, even regarding the flexible printed wiring board disclosed in Patent Document 2, since a printing process, dispensing process, or the like are required for forming the highly conductive adhesive or the adhesive having high adhesion properties, there is a problem in that productivity is deteriorated.

Problems to be solved by the present invention include providing a wiring board assembly having excellent productivity, and a method for producing same.

Means for Solving Problem

[1] A wiring board assembly according to the invention includes: a flexible printed wiring board which includes at least an insulating substrate including at least one first through-hole, and a wiring pattern provided on the insulating substrate and extending to a peripheral edge of the first through-hole; a metal reinforcing plate attached to the flexible printed wiring board and facing the first through-hole; and a solder connection portion covering a first inner wall surface of the first through-hole and electrically connecting the wiring pattern to the metal reinforcing plate. In the invention, since the wiring pattern of the flexible printed wiring board and the metal reinforcing plate are electrically connected to each other by the solder connection portion formed in the first through-hole by melting a solder on the first through-hole, the productivity of the wiring board assembly can be enhanced.

[2] In the above invention, the insulating substrate may further include at least one second through-hole of which a second inner wall surface is not covered with the solder connection portion, the wiring board assembly may further include at least one communication path interposed between the flexible printed wiring board and the metal reinforcing plate, and the communication path may allow the first through-hole and the second through-hole to communicate with each other. In this case, when the first through-hole is covered with the solder, the internal pressure of the first through-hole is released from the second through-hole via the communication path. Accordingly, the solder is easily received toward the metal reinforcing plate side, and thus the reliability of the connection between the wiring pattern and the metal reinforcing plate can be further enhanced.

[3] In the above invention, the second inner wall surface of the second through-hole may be exposed. In this case, the solder does not infiltrate into the second through-hole and does not block the second through-hole. Accordingly, the internal pressure of the first through-hole can be released from the second through-hole via the communication path. Therefore, the solder is easily received toward the metal reinforcing plate side, and thus the reliability of the connection between the wiring pattern and the metal reinforcing plate can be further enhanced.

[4] In the above invention, the wiring pattern may include a first wiring pattern provided on a first main surface of the insulating substrate, and a second wiring pattern provided on a second main surface of the insulating substrate, the flexible printed wiring board further includes a coverlay covering the first main surface and including an opening, the opening includes a first section facing the first through-hole and a peripheral edge portion of the first through-hole in the first wiring pattern, a second section facing the second through-hole, and a third section allowing the first section and the second section to communicate with each other, the communication path is defined by the opening, the metal reinforcing plate is attached to the coverlay, and the solder connection portion electrically connects the first wiring pattern, the second wiring pattern, and the metal reinforcing plate to each other. In this case, the first wiring pattern and the second wiring pattern are electrically connected to the metal reinforcing plate, and thus an electromagnetic shielding effect can be imparted to the flexible printed wiring board.

[5] In the above invention, the wiring pattern may include a first wiring pattern provided on a first main surface of the insulating substrate, and a second wiring pattern provided on a second main surface of the insulating substrate, the flexible printed wiring board further includes a coverlay covering the first main surface to expose the first through-hole and a peripheral edge portion of the first through-hole in the first wiring pattern, the metal reinforcing plate is attached to the coverlay, and the solder connection portion electrically connects the first wiring pattern, the second wiring pattern, and the metal reinforcing plate to each other. In this case, the first wiring pattern and the second wiring pattern are electrically connected to the metal reinforcing plate, and thus an electromagnetic shielding effect can be imparted to the flexible printed wiring board.

[6] In the above invention, the solder connection portion may cover at least a portion of a region projected the first through-hole onto the metal reinforcing plate. In this case, the area of portions of the flexible printed wiring board and the metal reinforcing plate which are connected by the solder connection portion is increased, and thus the reliability of the connection between the wiring pattern and the metal reinforcing plate can be further enhanced.

[7] In the above invention, the first inner wall surface may include a metal coating layer. In this case, the reliability of the connection between the wiring pattern and the metal reinforcing plate can be further enhanced by the solder connection portion.

[8] In the above invention, the insulating substrate may include a plurality of the first through-holes. In this case, when the solder connection portion is formed, the solder is easily received toward the metal reinforcing plate side, and thus the reliability of the connection between the wiring pattern and the metal reinforcing plate can be further enhanced.

[9] In the above invention, the metal reinforcing plate may include a convex portion inserted into the first through-hole. In this case, the area of portions of the flexible printed wiring board and the metal reinforcing plate which are connected by the solder connection portion is increased, and thus the reliability of the connection between the wiring pattern and the metal reinforcing plate can be further enhanced.

[10] A method for producing a wiring board assembly according to the invention, includes: a first process of preparing a flexible printed wiring board which includes at least an insulating substrate including a first through-hole, and a wiring pattern provided in the insulating substrate and extending to a peripheral edge of the first through-hole; a second process of attaching a metal reinforcing plate to the flexible printed wiring board from one side; a third process of printing a solder paste over the first through-hole of the flexible printed wiring board from the other side; and a fourth process of electrically connecting the wiring pattern and the metal reinforcing plate to each other by melting the solder paste. In the invention, the wiring pattern and the metal reinforcing plate can be electrically connected to each other using the solder paste during surface mount process, and an additional process or the like for applying a flux to the metal reinforcing plate during the connection process does not need to be provided. Therefore, the productivity of the wiring board assembly can be enhanced.

Effect of the Invention

According to the invention, since the wiring pattern of the flexible printed wiring board and the metal reinforcing plate can be electrically connected to each other by the solder connection portion formed in the first through-hole by melting the solder on the first through-hole, the productivity of the wiring board assembly can be enhanced.

BRIEF DESCRIPTION OF DRAWINGS

FIGS. 6(A) and 6(B) are views illustrating a wiring board assembly in a second embodiment of the invention, in which FIG. 6(A) is a plan view, and FIG. 6(B) is a sectional view taken along the line VIB-VIB of FIG. 6(A).

FIGS. 8(A) and 8(B) are views illustrating a modification example of the wiring board assembly in the second embodiment of the invention, in which FIG. 8(A) is a plan view, and FIG. 8(B) is a sectional view taken along the line VIIIB-VIIIB of FIG. 8(A).

FIGS. 9(A) and 9(B) are views illustrating a wiring board assembly in a third embodiment of the invention, in which FIG. 9(A) is a plan view, and FIG. 9(B) is a sectional view taken along the line IXB-IXB of FIG. 9(A).

MODE(S) FOR CARRYING OUT THE INVENTION

Hereinafter, embodiments of the invention will be described with reference to the drawings.

«First Embodiment»

Figure 1:
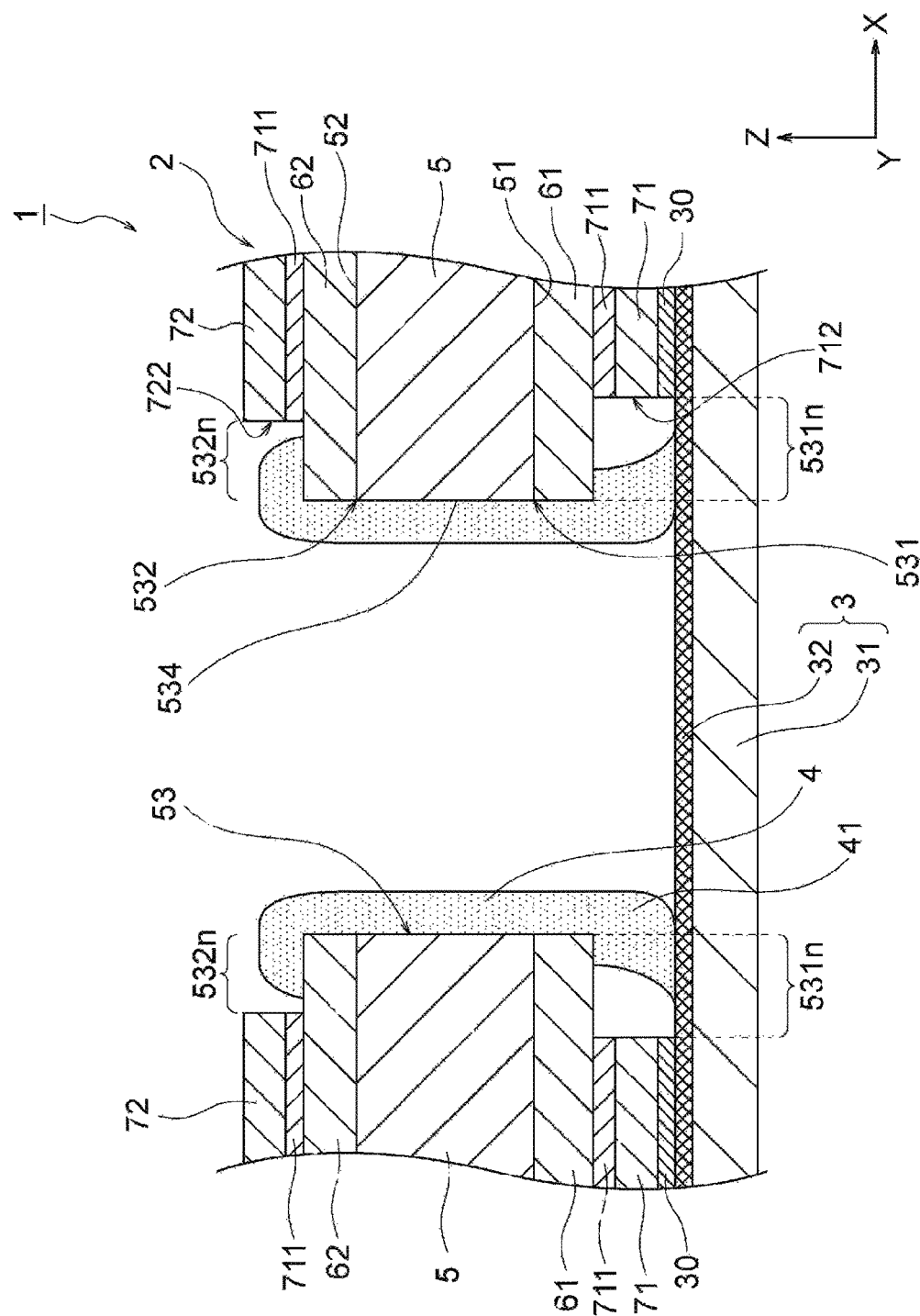
FIG. 1 is a sectional view illustrating a wiring board assembly in a first embodiment of the invention.

A wiring board assembly 1 in an embodiment includes, as illustrated in FIG. 1, a flexible printed wiring board 2, a metal reinforcing plate 3 attached to the flexible printed wiring board 2, and a solder connection portion 4.

Figure 2A:
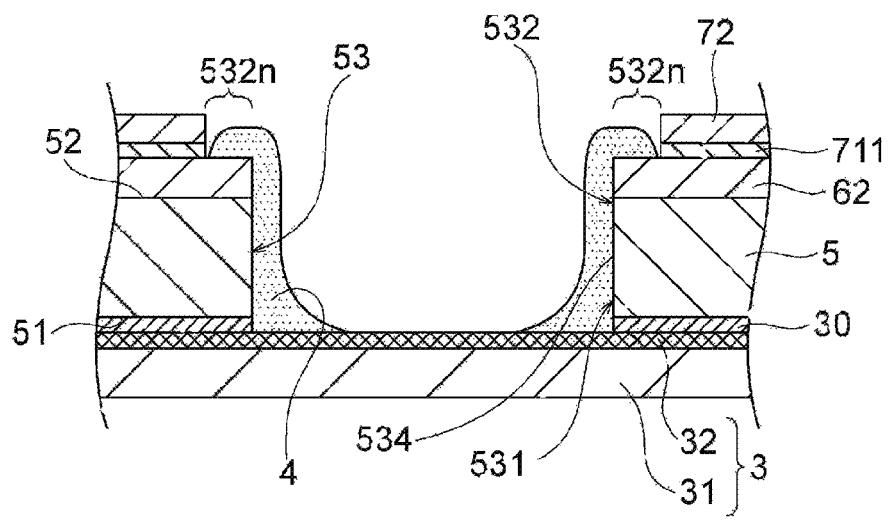
FIGS. 2(A) and 2(B) are sectional views illustrating a modification example of the wiring board assembly in the first embodiment of the invention.
Figure 2B:
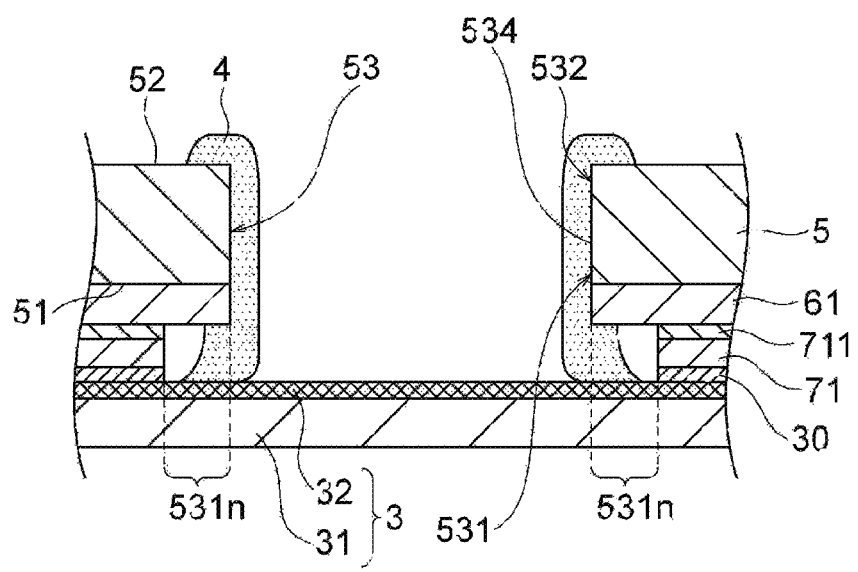

The flexible printed wiring board 2 includes an insulating substrate 5, a first wiring pattern 61 and a second wiring pattern 62 which are provided in the insulating substrate 5, a first coverlay 71, and a second coverlay 72. As illustrated in FIG. 2(A) or 2(B), any one of the first wiring pattern 61 and the second wiring pattern 62 may also be omitted.

The insulating substrate 5 is formed of a flexible insulating substrate, and examples of the material forming the substrate include polyimide, polyethylene terephthalate, and polyethylene naphthalate.

In the insulating substrate 5 in this embodiment, as illustrated in FIG. 1, a through-hole 53 which is formed to penetrate through a main surface 51 on the lower side of the insulating substrate 5 in the figure (hereinafter, referred to as a first main surface 51) and a main surface 52 on the upper side thereof in the figure (hereinafter, referred to as a second main surface 52) along the vertical direction (Z direction in the figure) is provided. The through-hole 53 is open to a first opening 531 in the first main surface 51 and is open to a second opening 532 in the second main surface 52. In addition, the through-hole 53 in this embodiment corresponds to an example of a first through-hole of the invention.

The first wiring pattern 61 formed of a copper foil or the like is provided on the first main surface 51 in the insulating substrate 5. The first wiring pattern 61 is provided to extend to a peripheral edge portion 531n of the first opening 531 in the through-hole 53 provided in the insulating substrate 5. On the lower side of the first wiring pattern 61 in the figure, a first coverlay 71 which covers the first wiring pattern 61 and the first main surface 51 of the insulating substrate 5 is provided.

The first coverlay 71 is formed of an insulating film such as polyimide, polyethylene terephthalate, or polyethylene naphthalate, and as illustrated in FIG. 1, includes a through-hole 712 which exposes the peripheral edge portion 531n of the first opening 531 in the through-hole 53. In addition, the first coverlay 71 covers the first main surface 51 of the insulating substrate 5 and the first wiring pattern 61 so as to allow the through-hole 712 to correspond to the first opening 531, and the first coverlay 71 is attached to the first main surface 51 and the first wiring pattern 61 with an adhesive 711. The adhesive 711 may be exemplified by an epoxy or acrylic adhesive.

The second wiring pattern 62 formed of a copper foil or the like is provided on the second main surface 52 in the insulating substrate 5. The second wiring pattern 62 is provided to extend to a peripheral edge portion 532n of the second opening 532 in the through-hole 53 provided in the insulating substrate 5. On the upper side of the second wiring pattern 62 in the figure, a second coverlay 72 which covers the second wiring pattern 62 and the second main surface 52 of the insulating substrate 5 is provided.

The second coverlay 72 is formed of the same material as that of the first coverlay 71, and as illustrated in FIG. 1, includes a through-hole 722 which exposes the peripheral edge portion 532n of the second opening 532 in the through-hole 53. In addition, the second coverlay 72 covers the second main surface 52 of the insulating substrate 5 and the second wiring pattern 62 so as to allow the through-hole 722 to correspond to the second opening 532, and the second coverlay 72 is attached to the second main surface 52 and the second wiring pattern 62 with the adhesive 711.

The first and second coverlays 71 and 72 are provided to protect the first and second wiring patterns 61 and 62, respectively, and ensure insulation thereof. Therefore, in a case where the first wiring pattern 61 is omitted, as illustrated in FIG. 2(A), the first coverlay 71 may also be omitted. Similarly, in a case where the second wiring pattern 62 is omitted, as illustrated in FIG. 2(B), the second coverlay 72 may also be omitted.

In this embodiment, the first and second wiring patterns 61 and 62 are formed as ground wiring for shielding the flexible printed wiring board 2 from electromagnetic noise. Although not particularly illustrated, separately from the first and second wiring patterns 61 and 62, signal wiring is formed in the first main surface 51 and the second main surface 52 of the insulating substrate 5. Furthermore, for example, the first wiring pattern 61 may also be a linear pattern or a blanket pattern (so-called solid pattern), while the second wiring pattern 62 is a linear pattern.

In this embodiment, as illustrated in FIG. 1, the metal reinforcing plate 3 is attached to the first coverlay 71 in the flexible printed wiring board 2 described above, with an epoxy or acrylic adhesive 30. The metal reinforcing plate 3 includes a base substrate 31 formed of aluminum or the like, and a coating layer 32 which is formed of nickel (Ni), tin (Sn), or the like on the base substrate 31. The metal reinforcing plate 3 is attached to the flexible printed wiring board 2 so that the coating layer 32 faces the first coverlay 71. In a case where the first wiring pattern 61 is omitted, as illustrated in FIG. 2(A), the metal reinforcing plate 3 may be attached to the first main surface 51 of the insulating substrate 5.

In addition, the wiring board assembly 1 in this embodiment includes the solder connection portion 4 which covers an inner wall surface 534 of the through-hole 53 of the insulating substrate 5. As illustrated in FIG. 1, the solder connection portion 4 comes into contact with the first wiring pattern 61 in the peripheral edge portion 531n of the first opening 531 and comes into contact with the second wiring pattern 62 in the peripheral edge portion 532n of the second opening 532. In addition, a lower end 41 of the solder connection portion 4 comes into contact with the coating layer 32 of the metal reinforcing plate 3. Accordingly, the first wiring pattern 61, the second wiring pattern 62, and the metal reinforcing plate 3 are electrically connected to each other by the solder connection portion 4.

Figure 3:
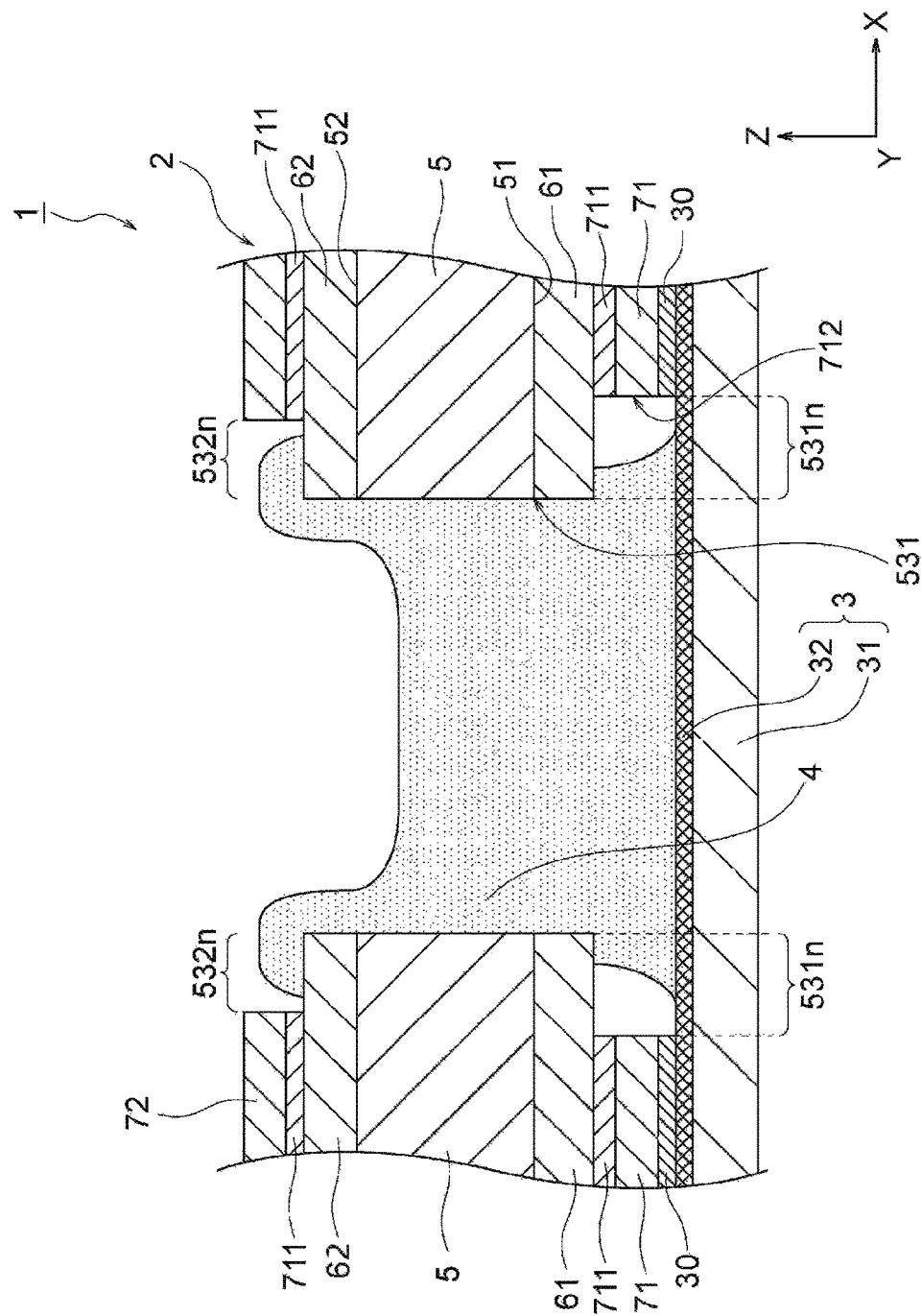
FIG. 3 is a sectional view illustrating a modification example of the wiring board assembly in the first embodiment of the invention.

The solder connection portion 4, as illustrated in FIG. 3, may also be configured to fill the through-hole 53 with a solder. The amount of the solder filling the through-hole 53 is not particularly limited, and although not particularly illustrated, for example, the solder connection portion 4 may also be configured to fill only the bottom of the through-hole 53 with the solder. That is, the solder connection portion 4 may cover a region projected the through-hole 53 onto the metal reinforcing plate 3 with the solder.

Otherwise, as illustrated in FIG. 2(A), the solder may spread on the bottom of the through-hole 53, and a portion of the metal reinforcing plate 3 may be exposed from the solder connection portion 4. That is, the solder connection portion 4 may cover a portion of the region projected the through-hole 53 onto the metal reinforcing plate 3 with the solder.

In a case where the first wiring pattern 61 is omitted (in the case of FIG. 2(A)), the second wiring pattern 62 and the metal reinforcing plate 3 are electrically connected to each other by the solder connection portion 4. In addition, in a case where the second wiring pattern 62 is omitted (in the case of FIG. 2(B)), the first wiring pattern 61 and the metal reinforcing plate 3 are electrically connected to each other by the solder connection portion 4.

Next, a method for producing the wiring board assembly 1 in this embodiment will be described. The method for producing the wiring board assembly 1 in this embodiment includes a flexible printed wiring board preparing process, a metal reinforcing plate attaching process, a solder paste printing process, and a reflow process.

The flexible printed wiring board preparing process in this embodiment corresponds to an example of a first process of the invention, the metal reinforcing plate attaching process in this embodiment corresponds to an example of a second process of the invention, a solder paste printing process in this embodiment corresponds to an example of a third process of the invention, and a reflow process in this embodiment corresponds to an example of a fourth process of the invention.

Figure 4:
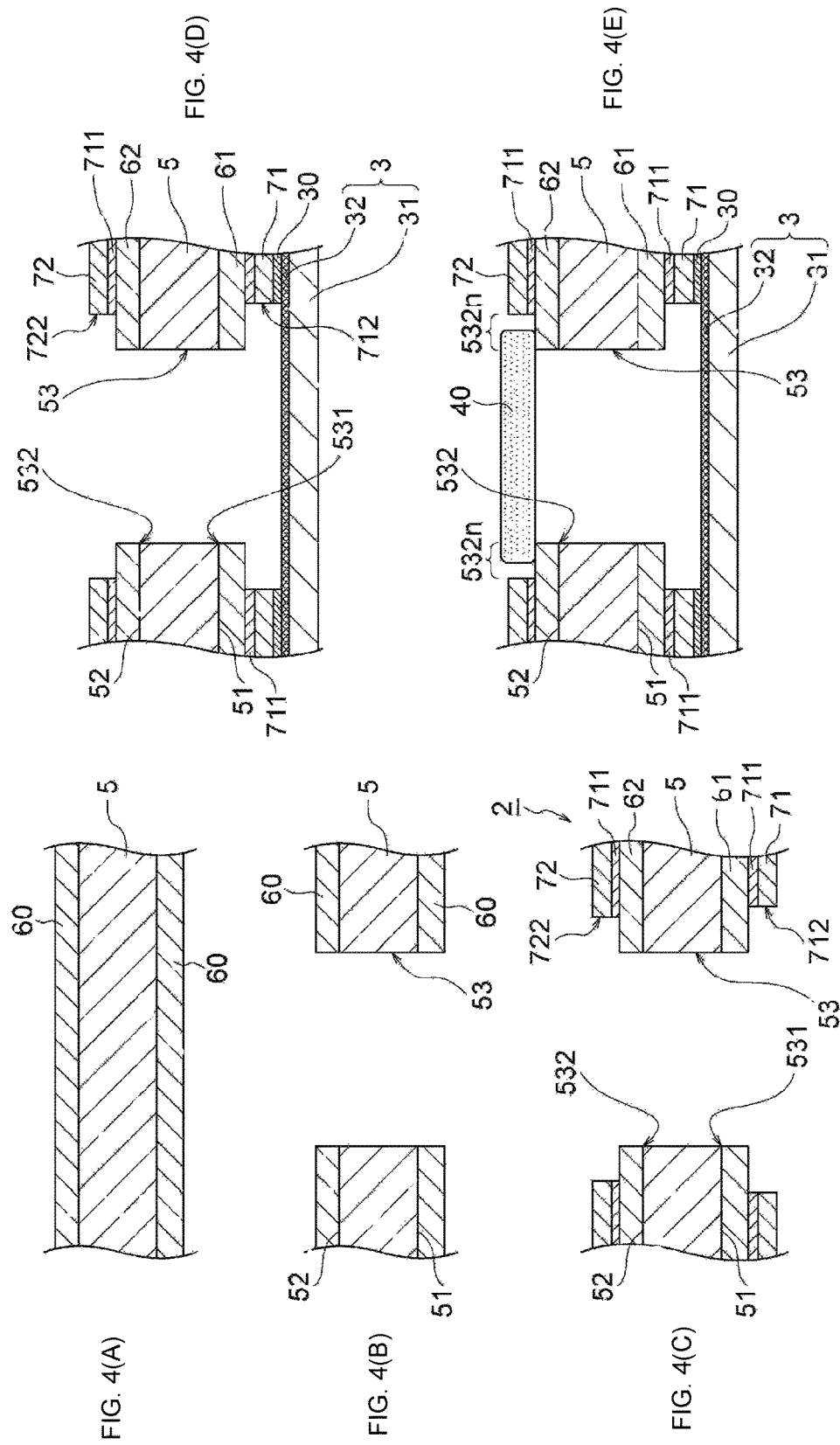
FIGS. 4(A) to 4(E) are sectional views illustrating a production process of the wiring board assembly in the first embodiment of the invention.

In the flexible printed wiring board preparing process, as illustrated in FIG. 4(A), a laminated plate in which conductive members 60 formed of a copper foil or the like and, for example, having a thickness of about 12 μm to 18μm are adhered to both surfaces of the insulating substrate 5, for example, having a thickness of about 12.5 μm to 25 μm is prepared. The following description of the production method is based on that the conductive member 60 is a copper foil.

Subsequently, as illustrated in FIG. 4(B), the through-hole 53, for example, having a diameter of about 0.1 mm to 5 mm is formed in the laminated plate prepared as described above using a drill or a UV-YAG laser. At this time, in the case of forming the through-hole 53 using the drill, the drilling speed and the rotation frequency of the drill are appropriately adjusted so as not to generate a hole burr.

In the case of forming the through-hole 53 using the UV-YAG laser, the laser power, the number of shots, the depth of focus, and the like are adjusted by using a Gaussian beam so as to form the through-hole 53 having a desired shape. At this time, there may be cases where the conductive member 60 is melted and scatters due to heat from the laser. Therefore, the conductive member 60 is etched, for example, by about 0.5 μm to 1 μm after the laser processing so as to smoothen the surface shape of the conductive member 60.

Subsequently, the first wiring pattern 61 is formed in the conductive member 60 on the first main surface 51 side of the insulating substrate 5.

Specifically, first, an acrylic dry film resist is thermocompression-bonded to the conductive member 60, for example, under the condition of a temperature of 70° C. to 110° C. and a pressure of 0.5 MPa while not allowing bubbles to be incorporated between the surface of the conductive member 60 and the resist. Subsequently, a positive type or negative type photomask selected according to the properties of the dry film resist is attached to the surface of the dry film resist through evacuation, and the photomask and the dry film resist is irradiated with UV light.

The photomask used at this time is constituted by a base material, which is formed of a polyethylene terephthalate (PET) film, a glass dry plate, or the like, and a patterning thin film such as a chromium film or an emulsion film, and the constituent materials are appropriately selected according to the production costs, circuit width tolerance, dimensional tolerance, and the like.

Subsequently, the dry film resist in which a crosslinking reaction due to the UV light irradiation does not occur is removed for development so as to form a dry film resist having a circuit shape. For example, the development may be performed by spraying an alkali solution such as a 1.0% wt sodium carbonate ($Na_2CO_3$) aqueous solution onto the surface of the dry film resist at a pressure of 0.1 MPa to 0.25 MPa for a predetermined period of time.

Subsequently, the conductive member 60 is etched by using the dry film resist having the circuit shape as a mask so as to form the first wiring pattern 61. For example, the etching may be performed by spraying a chemical solution containing iron(III) chloride ($FeCl_3$) or copper(II) chloride ($CuCl_2$) onto the conductive member 60 at a pressure of 0.25 Mpa for a predetermined period of time.

After the etching, the dry film resist is swelled and stripped from the conductive member 60 by immersion into the above alkali solution, therefore the first wiring pattern 61 can be formed in the conductive member 60. In the same manner, the second wiring pattern 62 is formed in the conductive member 60 on the second main surface 52 side of the insulating substrate 5.

Subsequently, as illustrated in FIG. 4(C), the first coverlay 71 which is formed of polyimide and, for example, has a thickness of about 12.5 μm is attached to the lower surface of the first wiring pattern 61 in the figure using the adhesive 711 which is formed of a thermosetting adhesive and has a thickness of about 20 μm to 25 μm. In addition, the second coverlay 72 having the same configuration as that of the first coverlay 71 is attached to the upper surface of the second wiring pattern 62 in the figure using the adhesive 711.

Specifically, first, the through-hole 712 which exposes the peripheral edge portion 531n of the first opening 531 in the insulating substrate 5 is formed in the first coverlay 71 by a router, laser, or die. In addition, the first coverlay 71 is arranged to allow the through-hole 712 to correspond to the first opening 531 of the insulating substrate 5 via the adhesive 711, and is locally heated to be temporarily fixed thereto. Subsequently, in this state, thermocompression bonding is performed, for example, under the condition of 160° C. and 40 kgf for two hours while not allowing bubbles to be incorporated between the first main surface 51 and the first coverlay 71, such that the first coverlay 71 is fixed.

In the same manner, the through-hole 722 which exposes the peripheral edge portion 532n of the second opening 532 in the insulating substrate 5 is formed in the second coverlay 72, and the second coverlay 72 is arranged and fixed to allow the through-hole 722 to correspond to the second opening 532 of the insulating substrate 5.

Figure 5:
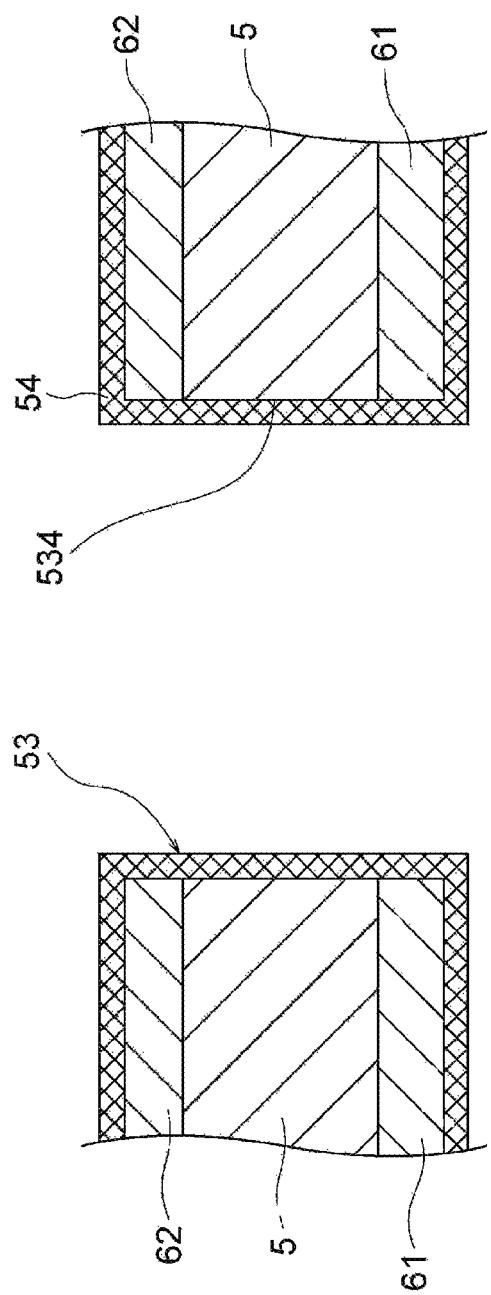
FIG. 5 is a sectional view illustrating a modification example of the wiring board assembly in the first embodiment of the invention.

As described above, the flexible printed wiring board 2 is prepared. As illustrated in FIG. 5, when the through-hole 53 is formed (stage of FIG. 4(B)), the inner wall surface 534 of the through-hole 53 may also have a metal coating layer 54 which is formed of copper or the like and, for example, has a thickness of 5 μm to 12 μm. In this case, the first wiring pattern 61 formed on the first main surface 51 of the insulating substrate 5 and the second wiring pattern 62 formed on the second main surface 52 are electrically connected to each other by the metal coating layer 54. At this time, for roughening and cleaning of the surface of the conductive member 60 after coating, the conductive member 60 may also be etched by 0.5 μm to 1 μm.

Next, the metal reinforcing plate attaching process will be described.

In the metal reinforcing plate attaching process, first, the adhesive 30, which is formed of a thermosetting adhesive processed to a predetermined shape (individual shape, band shape, or the like) and, for example, has a thickness of about 10 μm to 25 μm, is arranged on the lower surface of the flexible printed wiring board 2 in FIG. 4(D) (the lower surface of the first coverlay 71 in FIG. 4(D)). In addition, in this state, the adhesive 30 is temporarily fixed by locally heating the adhesive 30 to 200° C. or higher using a soldering iron or the like. In a case where the adhesive 30 is interposed between releasing materials, the adhesive 30 interposed between the releasing materials is processed to a desired shape by a laser or a die, and then the adhesive 30 is temporarily fixed by peeling off one releasing material to expose the surface of the adhesive.

Subsequently, the flexible printed wiring board 2 to which the adhesive 30 is temporarily fixed is interposed between films having good releasing properties, and vacuum heat pressing is performed. At this time, for example, vacuuming is conducted so as to set the degree of vacuum to −70 cmHg or less within 10 seconds to 60 seconds, and thermocompression bonding is performed under 10 $kgf/cm^2$ to 20 $kgfk/cm^2$ at 120° C. for 10 seconds to 120 seconds.

Subsequently, the metal reinforcing plate 3 of which the surface is coated with nickel (Ni), tin (Sn), or the like and which has a thickness of about 0.1 mm to 1 mm is arranged at a predetermined position of the lower surface of the adhesive 30, and is locally heated to 200° C. or higher using the soldering iron or the like, such that the metal reinforcing plate 3 is temporarily fixed.

In addition, the flexible printed wiring board 2 and the metal reinforcing plate 3 are interposed between films having good releasing properties, and vacuum heat pressing is performed. At this time, for example, vacuuming is conducted so as to set the degree of vacuum to −70 cmHg or less within 10 seconds to 60 seconds, and thermocompression bonding is performed under 10 $kgf/cm^2$ to 20 $kgf/cm^2$ at 120° C. for 10 seconds to 120 seconds. Thereafter, the adhesive 30 is cured in an oven at 150° C. to 180°

C. such that the metal reinforcing plate 3 is attached to the first coverlay 71 of the flexible printed wiring board 2 (see FIG. 4(D)).

Subsequently, in the solder paste printing process, as illustrated in FIG. 4(E), the solder paste 40 is printed over the through-hole 53 so as to allow the solder paste 40 to cover the peripheral edge portion 532n of the second opening 532. For example, the solder paste used for the printing may be exemplified by a paste including a composition of tin (Sn), 3.0% silver (Ag), and 0.5% copper (Cu), or the like. In addition, a method of printing the solder paste 40 may be exemplified by a screen printing method, a gravure offset printing method, or the like.

Subsequently, in the reflow process, the solder paste 40 is melted and is cured to form the solder connection portion 4 such that the first and second wiring patterns 61 and 62 and the metal reinforcing plate 3 are electrically connected to each other. As for the conditions of the reflow process, for example, preheating is performed at 130° C. to 190° C. for 60 seconds to 90 seconds, and reflowing is performed at 220° C. or higher for 30 seconds to 50 seconds. In this case, the peak temperature in a heating profile is 240° C. to 250° C. within 10 seconds.

Next, the actions of the wiring board assembly 1 and the method for producing the same in this embodiment will be described.

In the production process of the wiring board assembly 1 in this embodiment, as the solder paste 40 used in the solder paste printing process, a solder paste used during mounting can be used. In addition, by melting and curing the solder paste 40 in the through-hole 53, the first and second wiring patterns 61 and 62 and the metal reinforcing plate 3 can be electrically connected to each other. Therefore, an additional apparatus or process for performing the connection is not necessary, and thus the productivity of the wiring board assembly 1 can be enhanced.

In a case where the metal reinforcing plate attaching process is performed after the solder paste printing process and the reflow process, an additional process of applying a flux to the metal reinforcing plate is necessary when the metal reinforcing plate is attached and connected to the flexible printed wiring board.

Contrary to this, in this embodiment, the metal reinforcing plate attaching process is performed before the solder paste printing process and the reflow process. Accordingly, an additional process of applying a flux to the metal reinforcing plate 3 is not necessary, and positional adjustment during the attachment of the metal reinforcing plate 3 is easily performed. Therefore, the productivity of the wiring board assembly 1 can be further enhanced.

In addition, in the reflow process in the production process of the wiring board assembly 1 of this embodiment, electrical connection between the first wiring pattern 61 and the metal reinforcing plate 3 and electrical connection between the second wiring pattern 62 and the metal reinforcing plate 3 can be simultaneously performed. Therefore, the productivity of the wiring board assembly 1 can be further enhanced.

In addition, since the first and second wiring patterns 61 and 62 as the ground wiring are electrically connected to the metal reinforcing plate 3, an electromagnetic shielding effect can be imparted to the flexible printed wiring board 2. Particularly, in this embodiment, since the ground wiring is formed on both the surfaces 51 and 52 of the insulating substrate 5, a more effective electromagnetic shielding effect can be exhibited.

In addition, in a case where the inner wall surface 534 of the through-hole 53 has the metal coating layer 54 as illustrated in FIG. 5, in the reflow process, electrical connection between the first and second wiring patterns 61 and 62 and the metal reinforcing plate 3 can be more reliably achieved.

«Second Embodiment»

Figure 6A:
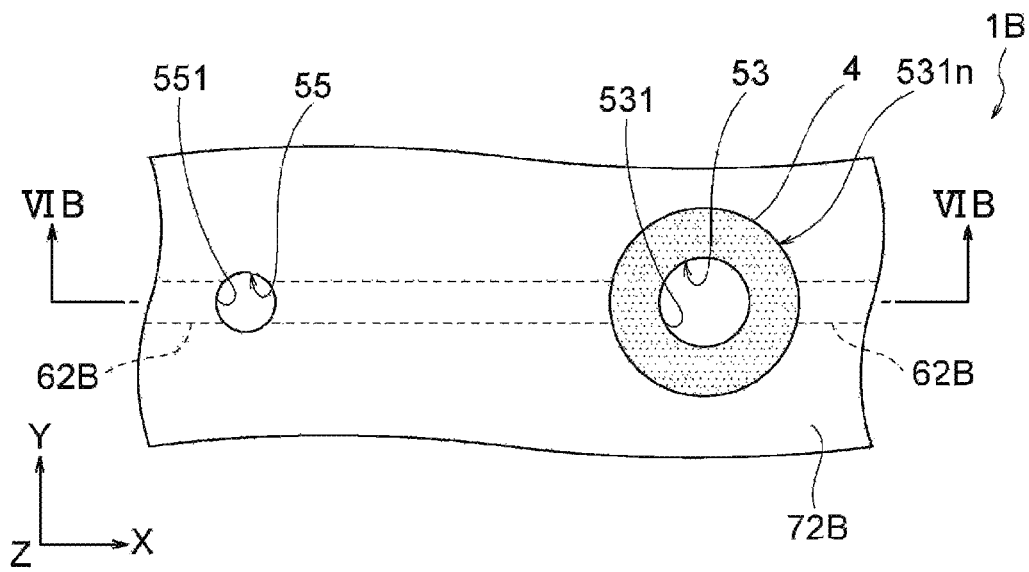
Figure 6B:
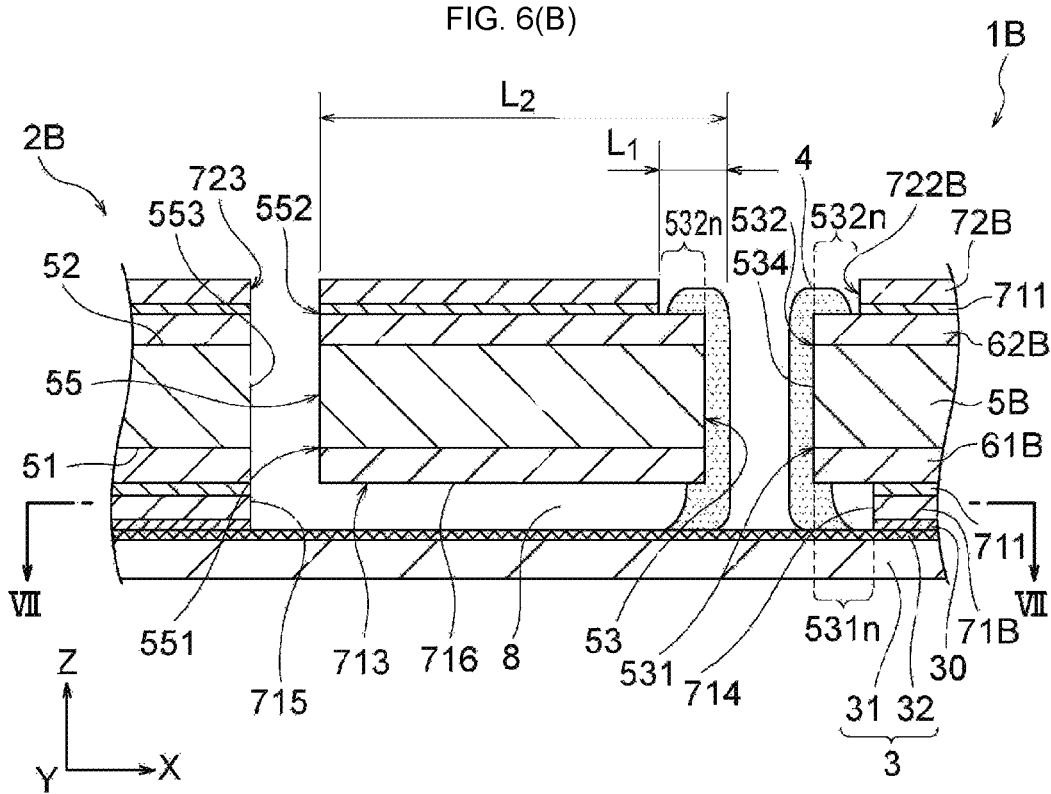

FIGS. 6(A) and 6(B) are views illustrating a wiring board assembly in a second embodiment of the invention, in which FIG. 6(A) is a plan view, and FIG. 6(B) is a sectional view taken along the line VIB-VIB of FIG. 6(A).

As illustrated in FIGS. 6(A) and 6(B), a wiring board assembly 1B in this embodiment includes a flexible printed wiring board 2B, the metal reinforcing plate 3 attached to the flexible printed wiring board 2B, the solder connection portion 4, and a communication path 8.

This embodiment is different from the first embodiment in that the single communication path 8 is provided in the wiring board assembly 1B, and a single second through-hole 55 is provided in an insulating substrate 5B.

The metal reinforcing plate 3 and the solder connection portion 4 included in the wiring board assembly 1B of the second embodiment have the same configurations as those included in the wiring board assembly 1 of the first embodiment, and thus description thereof will omitted.

The flexible printed wiring board 2B includes the insulating substrate 5B, a first wiring pattern 61B and a second wiring pattern 62B which are provided in the insulating substrate 5B, a first coverlay 71B, and a second coverlay 72B.

Similar to the insulating substrate 5 described in the first embodiment, the insulating substrate 5B is formed of a flexible insulating substrate, and the material forming the substrate is exemplified by the same material as the insulating substrate 5.

As illustrated in FIGS. 6(A) and 6(B), the insulating substrate 5B in this embodiment is provided with two through-holes. As in the first embodiment, the first through-hole 53 is formed to penetrate through the first main surface 51 and the second main surface 52 along the vertical direction (Z direction in the figure). The first through-hole 53 is open to the first opening 531 in the first main surface 51 and is open to the second opening 532 in the second main surface 52.

The second through-hole 55 is formed to penetrate through the first main surface 51 and the second main surface 52 along the vertical direction (Z direction in the figure). The second through-hole 55 is open to a first opening 551 in the first main surface 51 and is open to a second opening 552 in the second main surface 52. The diameter of the second through-hole 55 is not particularly limited, and is preferably smaller than the diameter of the first through-hole 53, for example, 0.2 mm or smaller. Accordingly, the area occupied by the first opening 551 in the first main surface 51 can be suppressed. In addition, the area occupied by the second opening 552 in the second main surface 52 can be suppressed. As described above, since the area occupied by the openings in the first main surface 51 and the second main surface 52 is suppressed, a wide region is ensured as the region in which electronic components are mounted, and thus the wiring patterns can be mounted at a higher density.

In this embodiment, as illustrated in FIG. 6(B), the first inner wall surface 534 of the first through-hole is covered with the solder connection portion 4. Contrary to this, a second inner wall surface 553 of the second through-hole 55 is not covered with the solder connection portion 4 and the second inner wall surface 553 is exposed.

The second through-hole 55 in this embodiment corresponds to an example of a second through-hole of the invention.

The first wiring pattern 61B formed of a copper foil or the like is provided on the first main surface 51 in the insulating substrate 5B. The first wiring pattern 61B is provided to extend to the peripheral edge portion 531n of the first opening 531 in the first through-hole 53 provided in the insulating substrate 5B, and is provided to extend to the first opening 551 in the second through-hole 55. On the lower side of the first wiring pattern 61B in the figure, a first coverlay 71B which covers the first wiring pattern 61B and the first main surface 51 of the insulating substrate 5B is provided.

The first coverlay 71B is formed of the same material as that of the first coverlay 71 described in the first embodiment, and covers the first main surface 51. As illustrated in FIG. 6(B), the first coverlay 71B has an opening 713 which is formed to penetrate through the first coverlay 71B along the vertical direction (Z direction in the figure).

Figure 7:
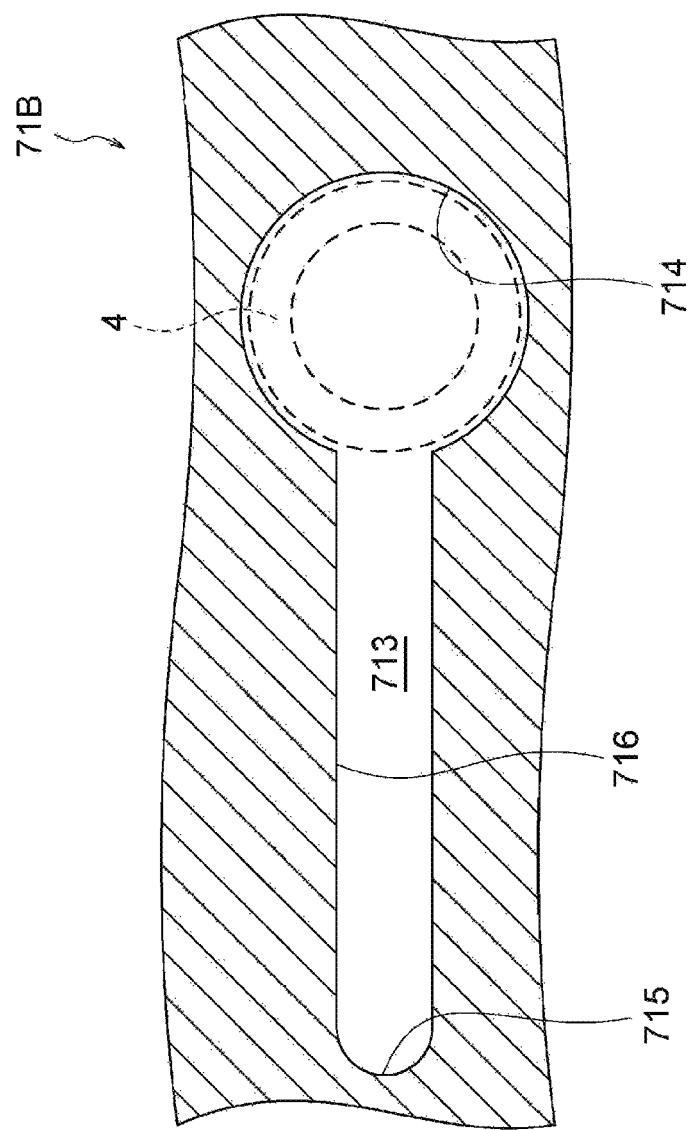
FIG. 7 is a view illustrating a first coverlay in the second embodiment of the invention, and is a sectional view taken along the line VII-VII of FIG. 6(B).

As illustrated in FIG. 7, the opening 713 includes a first section 714, a second section 715, and a third section 716 in a plan view. The first section 714 faces the peripheral edge portion 531n of the first opening 531 in the first through-hole 53. The second section 715 faces the first opening 551 in the second through-hole 55. The third section 716 allows the first section 714 and the second section 715 to communicate with each other. The first coverlay 71B is attached to the first main surface 51 and the first wiring pattern 61B with the adhesive 711.

Figure 8A:
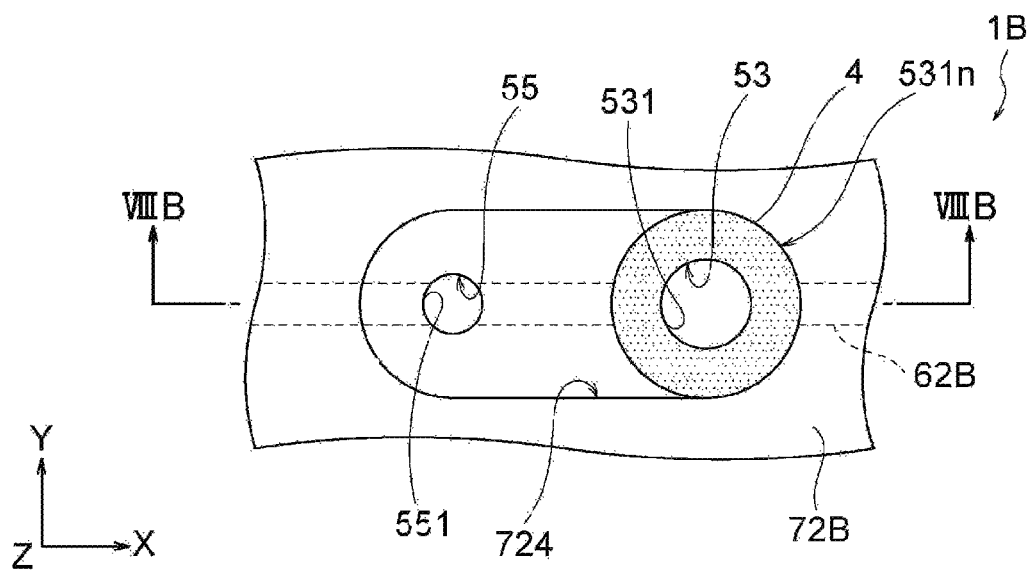
Figure 8B:
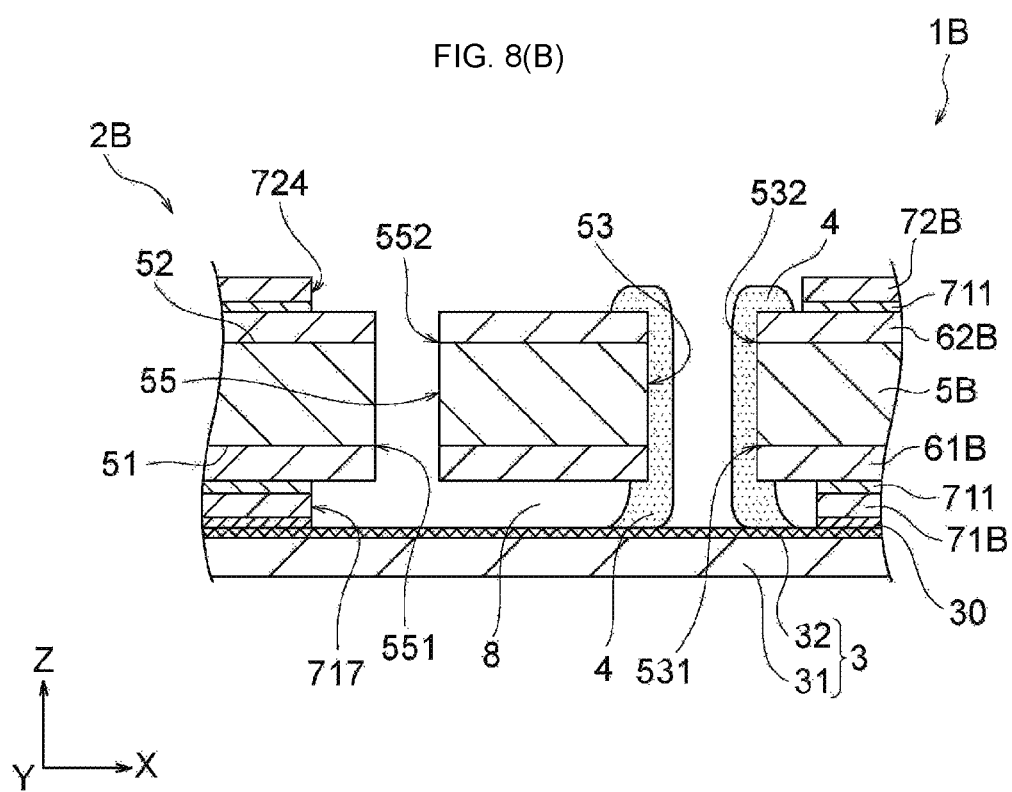

Instead of the opening 713 in the first coverlay 71B, as illustrated in FIGS. 8(A) and 8(B), a single opening 717 which includes the first section 714, the second section 715, and the third section 716 may also be formed. In this case, since the opening can have a simpler shape, the production process of the wiring board assembly 1B can be simplified.

The second coverlay 72B is formed of the same material as that of the second coverlay 72 described in the first embodiment. As illustrated in FIGS. 6(A) and 6(B), the second coverlay 72B includes a through-hole 722B and a through-hole 723, which are formed to penetrate the second coverlay 72B along the vertical direction (Z direction in the figure).

The through-hole 722B faces the peripheral edge portion 532n of the second opening 532 in the first through-hole 53. The through-hole 723 faces the second opening 552 in the second through-hole 55. The through-holes 722B and 723 are formed to expose the second opening 532 in the first through-hole 53 and the second opening 552 in the second through-hole 55. The second coverlay 72B provided with the through-holes 722B and 723 is attached to the second main surface 52 and the second wiring pattern 62B with the adhesive 711.

Instead of the through-holes 722B and 723 provided in the second coverlay 72B, as illustrated in FIGS. 8(A) and 8(B), a single through-hole 724 which includes the through-holes 722B and 723 may also be formed. In this case, since the opening can have a simpler shape, the production process of the wiring board assembly 1B can be simplified.

The communication path 8 is defined by the insulating substrate 5B, the metal reinforcing plate 3, the opening 713 provided in the first coverlay 71B, and the adhesive 711, and the communication path 8 is interposed between the insulating substrate 5B and the metal reinforcing plate 3. The communication path 8 allows the first through-hole 53 and the second through-hole 55 to communicate with each other.

As described above, since the communication path is provide in the wiring board assembly 1B, when the first through-hole 53 is covered with the solder, the internal pressure of the first through-hole 53 is released from the second through-hole 55 via the communication path 8. Accordingly, the solder is easily received toward the metal reinforcing plate 3 side, and thus the reliability of the connection between the wiring patterns 61B and 62B and the metal reinforcing plate 3 can be further enhanced.

In addition, in this embodiment, the single first through-hole 53 and the single second through-hole 55 are provided in the insulating substrate 5B, but the embodiment is not limited. Specifically, a plurality of first through-holes 53 and a single second through-hole 55 may also be provided in the insulating substrate 5B. Otherwise, a plurality of first through-holes 53 and a plurality of second through-holes 55 may also be provided in the insulating substrate 5B.

In such cases, a plurality of communication paths 8 may also be provided in the wiring board assembly 1B as long as the first through-holes 53 and the second through-holes 55 communicate with each other. In this case, the communication paths 8 may allow the plurality of first through-holes 53 to communicate with each other as long as the first through-holes 53 and the second through-holes 55 communicate with each other. The communication paths 8 may allow the plurality of second through-holes 55 to communicate with each other. In a case where the plurality of communication paths 8 are provided in the wiring board assembly 1B, the widths of the communication paths 8 may be different from each other.

In this embodiment, as illustrated in FIG. 6(B), a width L1 of the peripheral edge portion 532n of the second opening 532 in the first through-hole 53 is smaller than a distance (distance between the inner walls) between the first through-hole 53 and the second through-hole 55 (L1<L2).

As described above, since L1<L2 is satisfied, when the solder paste 40 is printed, the solder paste 40 is prevented from infiltrating into the second through-hole 55 and blocking the second through-hole 55. Accordingly, the internal pressure of the first through-hole 53 is released from the second through-hole 55 via the communication path 8, and thus the solder is easily received toward the metal reinforcing plate 3 side. Therefore, the reliability of the connection between the wiring patterns 61B and 62B and the metal reinforcing plate 3 can be further enhanced.

Next, a method for producing the wiring board assembly 1B in this embodiment will be described. The method for producing the wiring board assembly 1B in this embodiment also includes a flexible printed wiring board preparing process, a metal reinforcing plate attaching process, a solder paste printing process, and a reflow process.

First, the flexible printed wiring board preparation is performed by the same process as that in the first embodiment. The second through-hole 55 is formed by the same method as the method of forming the through-hole 53 described in the first embodiment.

At this time, the opening 713 is provided in the first coverlay 71B. The opening 713 is defined by the first section 714, the second section 715, and the third section 716. The first section 714 is formed to face the peripheral edge portion 531n of the first opening 531 in the first through-hole 53. The second section 715 is formed to face the first opening 551 in the second through-hole 55. The third section 716 is formed to allow the first section 714 and the second section 715 to communicate with each other.

The flexible printed wiring board 2B is prepared as described above. Subsequently, metal reinforcing plate attachment is performed by the same process as that in the first embodiment.

Subsequently, in the solder paste printing process, the solder paste 40 is printed over the first through-hole 53 so as to allow the solder paste 40 to cover the second opening 532 of the first through-hole 53.

Subsequently, in the reflow process, the solder paste 40 is melted. At this time, the solder paste 40 formed on the first through-hole 53 in a bridge shape is bent and infiltrates into the first through-hole 53. As described above, since the solder paste 40 is bent and infiltrates into the first through-hole 53, air in the first through-hole 53 is compressed and the internal pressure of the first through-hole 53 is increased. In addition, the air in the first through-hole 53 is heated by heat of melting of the solder paste 40. Accordingly, the air in the first through-hole 53 expands and the internal pressure of the first through-hole 53 is further increased.

In this case, the communication path 8 is provided in the wiring board assembly 1B, and the second through-hole 55 is provided in the insulating substrate 5B. Accordingly, the internal pressure of the first through-hole 53 is released from the second through-hole 55 via the communication path 8, and thus the solder is easily received toward the metal reinforcing plate 3 side. Therefore, the reliability of the connection between the wiring patterns 61B and 62B and the metal reinforcing plate 3 can be further enhanced.

Subsequently, the solder is cured to form the solder connection portion 4, such that the first and second wiring patterns 61B and 62B and the metal reinforcing plate 3 are electrically connected to each other.

Even in the production process of the wiring board assembly 1B of this embodiment, the connection process can be performed without providing an additional apparatus or process for electrically connecting the first and second wiring patterns 61B and 62B and the metal reinforcing plate 3 to each other, and thus the productivity of the wiring board assembly 1B can be enhanced.

Even in this embodiment, the metal reinforcing plate attaching process is performed before the solder paste printing process and the reflow process. Therefore, the productivity of the wiring board assembly 1B can be further enhanced.

In addition, even in this embodiment, in the reflow process, electrical connection between the first wiring pattern 61B and the metal reinforcing plate 3 and electrical connection between the second wiring pattern 62B and the metal reinforcing plate 3 can be simultaneously performed. Therefore, the productivity of the wiring board assembly 1B can be further enhanced.

In addition, in this embodiment, at least one first through-hole 53, at least one second through-hole 55, and at least one communication path 8 are provided in the insulating substrate 5B. Accordingly, even when the first through-hole 53 is covered with the solder, the internal pressure of the first through-hole 53 is released from the second through-hole 55 via the communication path 8. Therefore, the solder is easily received toward the metal reinforcing plate 3 side, and thus the reliability of the connection between the wiring patterns 61B and 62B and the metal reinforcing plate 3 can be further enhanced.

In addition, since the first and second wiring patterns 61B and 62B as the ground wiring are electrically connected to the metal reinforcing plate 3, an electromagnetic shielding effect can be imparted to the flexible printed wiring board 2B.

In addition, even in this embodiment, the inner wall surface 534 of the first through-hole 53 may have the same metal coating layer as the metal coating layer 54 as illustrated in FIG. 5. In this case, since the inner wall surface 534 of the first through-hole 53 has the metal coating layer 54, in the reflow process, electrical connection between the first and second wiring patterns 61B and 62B and the metal reinforcing plate 3 can be more reliably achieved. Although not particularly illustrated, similar to the first through-hole 53, the second inner wall surface 553 of the second through-hole 55 may also have the metal coating layer.

«Third Embodiment»

This embodiment is different from the first embodiment in that a plurality of (in this example, two) through-holes are provided in the insulating substrate, but other features are the same as those of the first embodiment. Hereinafter, only the differences from the first embodiment are described, like elements similar to those of the first embodiment are denoted by like reference numerals, and description thereof will be omitted.

Figure 9A:
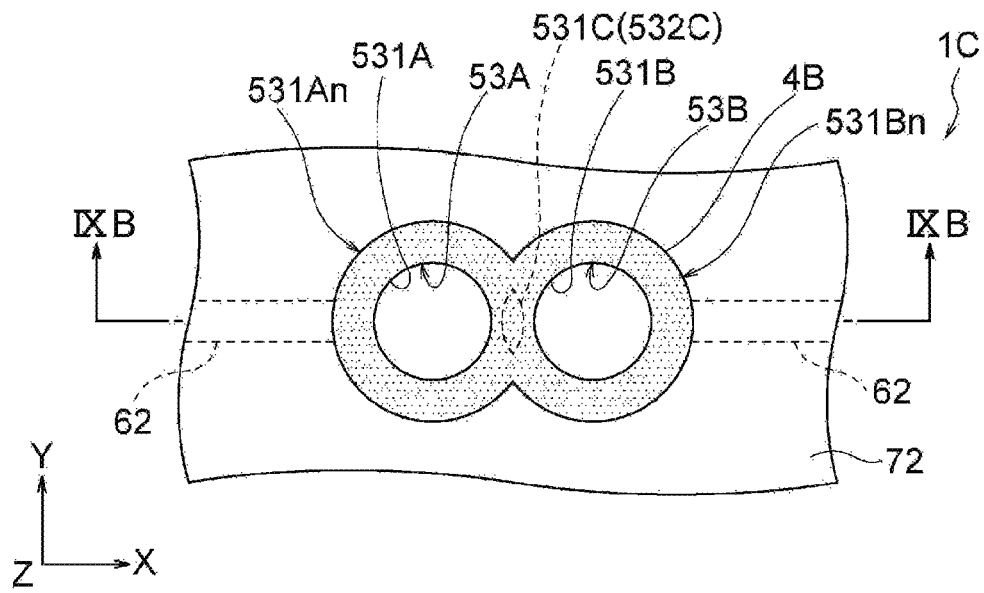
Figure 9B:
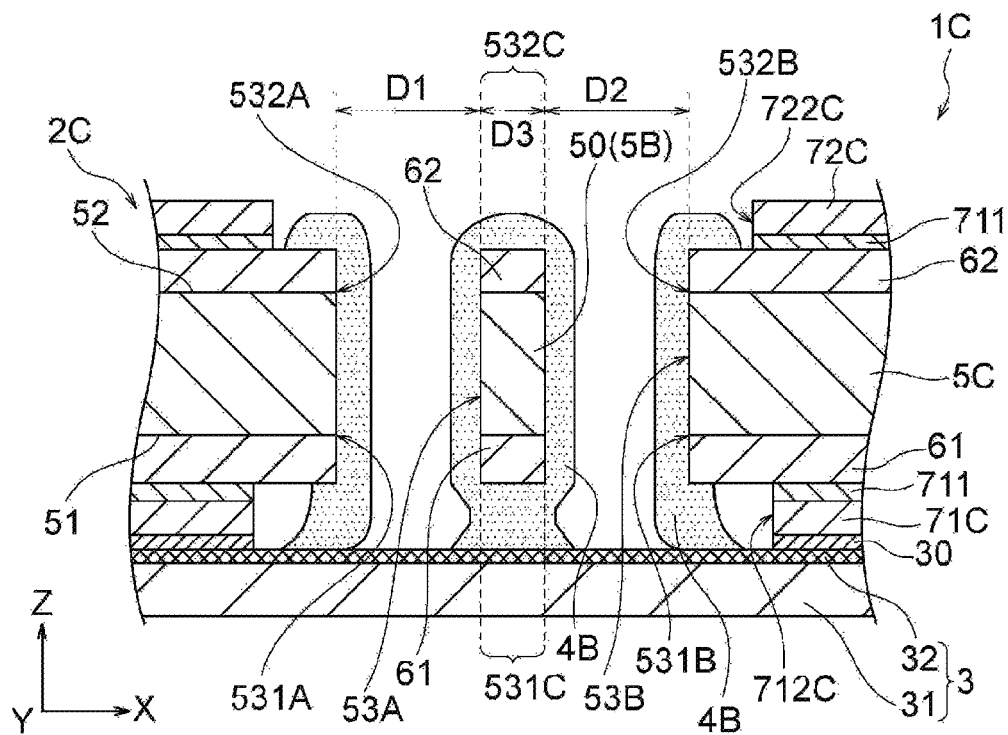

As illustrated in FIGS. 9(A) and 9(B), an insulating substrate 5C included in a flexible printed wiring board 2C of a wiring board assembly 1C in this embodiment is provided with a first through-hole 53A and a second through-hole 53B. The insulating substrate 5C has the same configuration as that of the insulating substrate 5 described in the first embodiment except for the number of through-holes provided therein.

The first and second through-holes 53A and 53B are formed along the vertical direction (Z direction in FIGS. 9(A) and 9(B)). In the first main surface 51 of the insulating substrate 5C, an overlap portion 531C, in which a peripheral edge portion 531An of a first opening 531A in the first through-hole 53A and a peripheral edge portion 531Bn of a first opening 531B in the second through-hole 53B overlap each other, is formed.

Similarly, in the second main surface 52 of the insulating substrate 5C, an overlap portion 532C, in which a peripheral edge portion 532An of a second opening 532A in the first through-hole 53A and a peripheral edge portion 532Bn of a second opening 532B in the second through-hole 53B overlap each other, is formed.

In this embodiment, a width D1 of the first through-hole 53A is equal to a width D2 of the second through-hole 53B (D1=D2). A width D3 of the overlap portion 532C (and the overlap portion 531C) is smaller than the widths D1 and D2 of the first and second through-holes 53A and 53B (D3≤D1 and D3≤D2). The width D3 of the overlap portion 532C (and the overlap portion 531C) is preferably 0.1 mm to 0.5 mm. The width D3 is preferably 50% to 100% of the widths D1 and D2 of the first and second through-holes 53A and 53B. In this case, the formation of voids in the solder connection portion 4B between the overlap portion 531C and the metal reinforcing plate 3 is suppressed, and thus cracking of the solder connection portion 4B due to the expansion of air in the voids can be prevented.

The first through-hole 53A and the second through-hole 53B in this embodiment correspond to an example of the first through-hole of the invention. The number of through-holes provided in the insulating substrate may be two or more. In addition, the widths of the plurality of through-holes provided in the insulating substrate may be different from each other.

The first wiring pattern 61 extends to at least one peripheral edge portion of the peripheral edge portion 531An of the first opening 531A in the first through-hole 53A and the peripheral edge portion 531Bn of the first opening 531B in the second through-hole 53B. Similarly, the second wiring pattern 62 also extends to at least one peripheral edge portion of the peripheral edge portion 532An of the second opening 532A in the first through-hole 53A and the peripheral edge portion 532Bn of the second opening 532B in the second through-hole 53B.

In this embodiment, as illustrated in FIG. 9(B), each of the inner wall surfaces of the first and second through-holes 53A and 53B is covered with the solder connection portion 4B. In addition, in the overlap portions 531C and 532C, the solder connection portion 4B covers the first and second wiring patterns 61 and 62, and the insulating substrate 5C (in the figure, an insulating substrate 50) positioned therebetween.

Next, a method for producing the wiring board assembly 1C in this embodiment will be described. The method for producing the wiring board assembly 1C in this embodiment also includes a flexible printed wiring board preparing process, a metal reinforcing plate attaching process, a solder paste printing process, and a reflow process.

In the flexible printed wiring board preparing process, as in the first embodiment, first, a laminated plate in which conductive members 60 formed of a copper foil or the like are adhered to both surfaces of the insulating substrate 5C is prepared.

Subsequently, the first through-hole 53A and the second through-hole 53B are formed in the prepared laminated plate. As a method of forming the first and second through-holes 53A and 53B, the same method as the method of forming the through-hole 53 described in the first embodiment is used.

Subsequently, using the same method as the method described in the first embodiment, the wiring patterns 61 and 62 are formed in the conductive members 60.

Subsequently, the through-hole 712C which exposes the peripheral edge portion 531An of the first opening 531A in the first through-hole 53A and the peripheral edge portion 531Bn of the first opening 531B in the second through-hole 53B is provided in the first coverlay 71C. In addition, the first coverlay 71C is attached to the first main surface 51 to allow the through-hole 712C to correspond to the first openings 531A and 531B in the first and second through-holes 53A and 53B.

Similarly, the through-hole 722C which exposes the peripheral edge portion 532An of the second opening 532A in the first through-hole 53A and the peripheral edge portion 532Bn of the second opening 532B in the second through-hole 53B is provided in the second coverlay 72C. In addition, the second coverlay 72C is attached to the second main surface 52 to allow the through-hole 722C to correspond to the second openings 532A and 532B in the first and second through-holes 53A and 53B.

The first coverlay 71C has the same configuration as the first coverlay 71 described in the first embodiment except that the through-hole 712C is provided. Similarly, the second coverlay 72C also has the same configuration as the second coverlay 72 described in the first embodiment except that the through-hole 722C is provided. In addition, as a method of attaching the first and second coverlays 71C and 72C respectively to the first and second wiring patterns 61 and 62, the same method as the method described in the first embodiment is used.

As described above, the flexible printed wiring board 2C is prepared. Subsequently, in the metal reinforcing plate attaching process, the metal reinforcing plate 3 is attached to the flexible printed wiring board 2C. The attachment of the metal reinforcing plate 3 to the flexible printed wiring board 2C is performed in the same method as that in the first embodiment.

Subsequently, in the solder paste printing process, the solder paste 40 is printed over the first and second through-holes 53A and 53B so as to allow the solder paste 40 to cover simultaneously the second opening 532A of the first through-hole 53A and the second opening 532B of the second through-hole 53B.

Subsequently, in the reflow process, the solder paste 40 is melted and is thereafter cured to form the solder connection portion 4B such that the first and second wiring patterns 61 and 62 and the metal reinforcing plate 3 are electrically connected to each other.

Even in the production process of the wiring board assembly 1C of this embodiment, the connection process can be performed without providing an additional apparatus or process for electrically connecting the first and second wiring patterns 61 and 62 and the metal reinforcing plate 3 to each other, and thus the productivity of the wiring board assembly 1C can be enhanced.

Even in this embodiment, the metal reinforcing plate attaching process is performed before the solder paste printing process and the reflow process. Therefore, the productivity of the wiring board assembly 1C can be further enhanced.

In addition, even in this embodiment, in the reflow process, electrical connection between the first wiring pattern 61 and the metal reinforcing plate 3 and electrical connection between the second wiring pattern 62 and the metal reinforcing plate 3 can be simultaneously performed. Therefore, the productivity of the wiring board assembly 1C can be further enhanced.

In addition, in this embodiment, the plurality of (in this example, two) through-holes 53A and 53B are provided in the insulating substrate 5C. Accordingly, when the solder paste 40 is melted in the reflow process, the melted solder is easily received toward the first main surface 51 side of the insulating substrate 5C due to the capillary action. In addition, the area of portions of the metal reinforcing plate 3 and the flexible printed wiring board 2C which are connected by the solder is increased. Therefore, electrical connection and mechanical connection between the first and second wiring patterns 61 and 62 and the metal reinforcing plate 3 can be more reliably achieved.

In addition, since the first and second wiring patterns 61 and 62 as the ground wiring are electrically connected to the metal reinforcing plate 3, an electromagnetic shielding effect can be imparted to the flexible printed wiring board 2C.

In addition, even in this embodiment, the inner wall surface of each of the first and second through-holes 53A and 53B may have the same metal coating layer as the metal coating layer 54 as illustrated in FIG. 5. In this case, in the reflow process, electrical connection between the first and second wiring patterns 61 and 62 and the metal reinforcing plate 3 can be more reliably achieved.

«Fourth Embodiment»

This embodiment is different from the first embodiment in that a convex portion is provided in the metal reinforcing plate, but other features are the same as those of the first embodiment. Hereinafter, only the differences from the first embodiment are described, like elements similar to those of the first embodiment are denoted by like reference numerals, and description thereof will be omitted.

Figure 10:
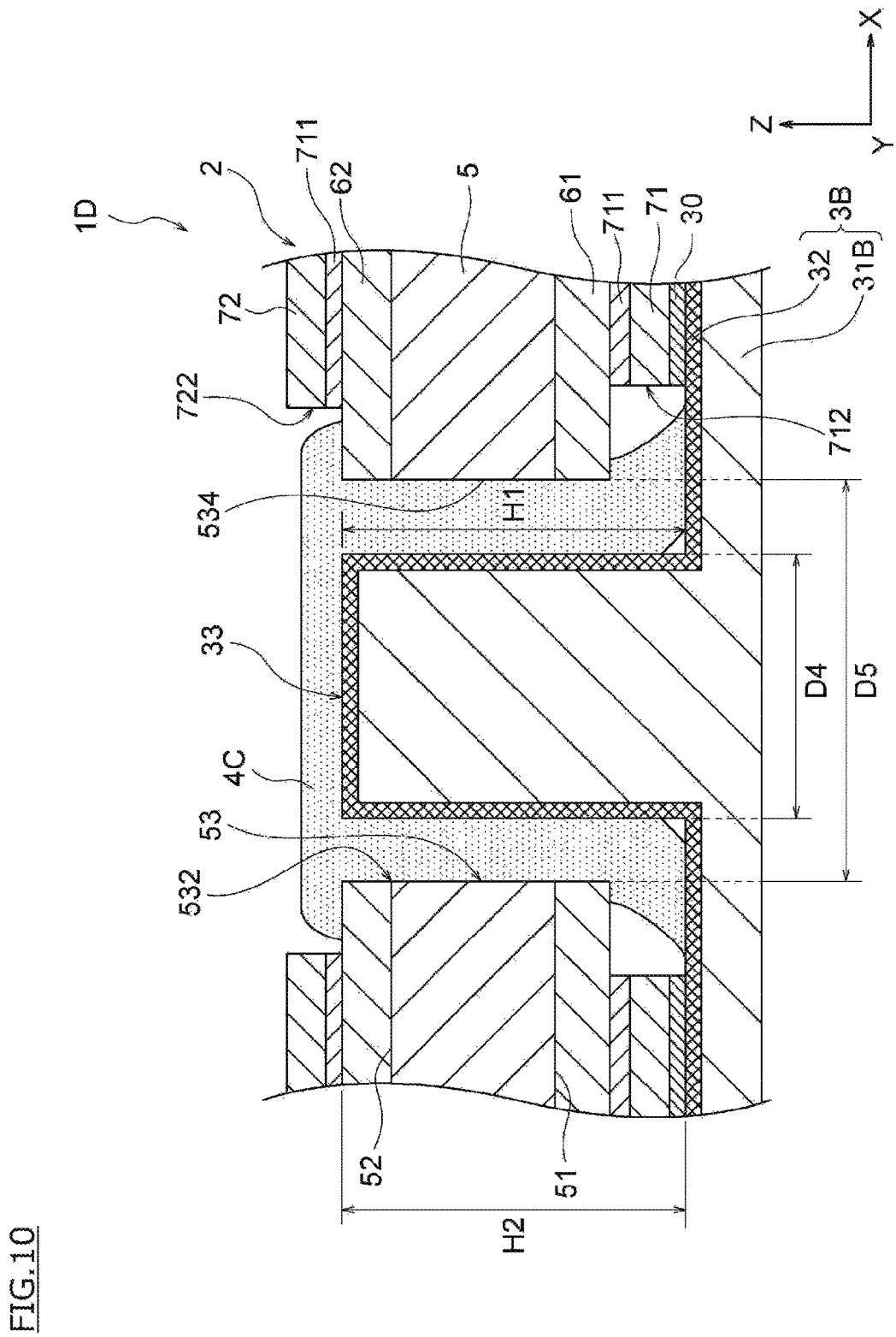
FIG. 10 is a sectional view illustrating a wiring board assembly in a fourth embodiment of the invention.

FIG. 10 is a sectional view illustrating a wiring board assembly of this embodiment.

As illustrated in FIG. 10, a metal reinforcing plate 3B included in a wiring board assembly 1D in this embodiment includes a convex portion 33, and the upper surface of the metal reinforcing plate 3B including the convex portion 33 in the figure includes a coating layer 32.

The convex portion 33 has a cylindrical shape formed along the vertical direction (Z direction in the figure), and is formed so that the center of the convex portion 33 corresponds to the center of the first and second openings 531 and 532 of the through-hole 53 in the plan view. A width D4 of the convex portion 33 is smaller than a width D5 of the through-hole 53 (D4<D5), and the convex portion 33 is inserted into the through-hole 53. The shape of the convex portion is not particularly limited. For example, the convex portion may have a rectangular (rectangular parallelepiped, or cubic) shape, a triangular pyramid shape, a conical shape, or the like.

In this embodiment, the surface of the convex portion 33 of the metal reinforcing plate 3B is covered with a solder connection portion 4C, and the inner wall surface 534 of the through-hole 53 in the insulating substrate 5 is also covered with the solder connection portion 4C.

Next, a method for producing the wiring board assembly 1D in this embodiment will be described. The method for producing the wiring board assembly 1D in this embodiment includes a flexible printed wiring board preparing process, a metal reinforcing plate attaching process, a solder paste printing process, and a reflow process.

In the flexible printed wiring board preparing process, the flexible printed wiring board 2 is prepared in the same manner as in the first embodiment.

Subsequently, in the metal reinforcing plate attaching process, first, a convex shape for forming the convex portion 33 is provided in a base substrate 31B included in the metal reinforcing plate 3B. A method of providing the convex shape may be exemplified by a mechanical process such as blasting, chemical etching, or the like.

Subsequently, the coating layer 32 is formed on the base substrate 31B. In addition, the metal reinforcing plate 3B is attached to allow the convex portion 33 to be inserted into the through-hole 53 of the flexible printed wiring board 2. As a method of forming the coating layer 32 and a method of attaching the metal reinforcing plate 3B to the flexible printed wiring board 2, the same methods as those described in the first embodiment are used.

Subsequently, in the solder paste printing process, the solder paste 40 is printed over the through-hole 53 so as to allow the solder paste 40 to cover the peripheral edge portion 532n of the second opening 532.

Subsequently, in the reflow process, the solder paste 40 is melted and is thereafter cured to form the solder connection portion 4C such that the first and second wiring patterns 61 and 62 and the metal reinforcing plate 3B are electrically connected to each other.

Even in the production process of the wiring board assembly 1D of this embodiment, the connection process can be performed without providing an additional apparatus or process for electrically connecting the first and second wiring patterns 61 and 62 and the metal reinforcing plate 3B to each other, and thus the productivity of the wiring board assembly 1D can be enhanced.

Even in this embodiment, the metal reinforcing plate attaching process is performed before the solder paste printing process and the reflow process. Therefore, the productivity of the wiring board assembly 1D can be further enhanced.

In addition, even in this embodiment, in the reflow process, electrical connection between the first wiring pattern 61 and the metal reinforcing plate 3B and electrical connection between the second wiring pattern 62 and the metal reinforcing plate 3B can be simultaneously performed. Therefore, the productivity of the wiring board assembly 1D can be further enhanced.

In addition, in this embodiment, the convex portion 33 is formed on the metal reinforcing plate 3B, and the convex portion 33 is inserted into the through-hole 53 of the insulating substrate 5. Accordingly, when the solder paste 40 is melted in the reflow process, the area of portions of the metal reinforcing plate 3B and the flexible printed wiring board 2 which are connected by the solder can be increased. Therefore, electrical connection and mechanical connection between the first and second wiring patterns 61 and 62 and the metal reinforcing plate 3B can be more reliably achieved.

A height H1 of the convex portion 33 formed on the metal reinforcing plate 3B is preferably the same as a height H2 to the upper surface of the second wiring pattern 62 in the flexible printed wiring board 2 (H1=H2, see FIG. 10). In this case, in the solder paste printing process, the printing properties of the solder paste 40 are enhanced, and thus electrical connection and mechanical connection between the first and second wiring patterns 61 and 62 and the metal reinforcing plate 3B can be more reliably achieved. The height H1 of the convex portion 33 may also be lower than the height H2 to the upper surface of the second wiring pattern 62 in the flexible printed wiring board 2 (H1<H2), and the height H2 to the upper surface of the second wiring pattern 62 in the flexible printed wiring board 2 may be lower than the height Hl of the convex portion 33 (H2<H1).

In addition, since the first and second wiring patterns 61 and 62 as the ground wiring are electrically connected to the metal reinforcing plate 3B, an electromagnetic shielding effect can be imparted to the flexible printed wiring board 2.

Even in this embodiment, in a case where the inner wall surface of the through-hole 53 has the metal coating layer 54 as illustrated in FIG. 5, in the reflow process, electrical connection between the first and second wiring patterns 61 and 62 and the metal reinforcing plate 3B can be more reliably achieved.

The embodiments described above are described to facilitate understanding of the invention, and are not described to limit the invention. Therefore, the elements described in the embodiments are intended to cover all changes in design and their equivalents without departing from the technical scope of the invention.

EXPLANATIONS OF LETTERS OR NUMERALS 1, 1B, 1C, 1D WIRING BOARD ASSEMBLY
2, 2B, 2C FLEXIBLE PRINTED WIRING BOARD
5, 5B, 5C INSULATING SUBSTRATE
51 FIRST MAIN SURFACE
52 SECOND MAIN SURFACE
53, 53A, 53B FIRST THROUGH-HOLE
531, 531A, 531B FIRST OPENING
531An, 531An, 531Bn PERIPHERAL EDGE PORTION
532, 532A, 532B SECOND OPENING
532An, 532An, 532Bn PERIPHERAL EDGE PORTION
534 INNER WALL SURFACE
54 METAL COATING LAYER
55 SECOND THROUGH-HOLE
551 FIRST OPENING
552 SECOND OPENING

553 INNER WALL SURFACE
61, 61B FIRST WIRING PATTERN
62, 62B SECOND WIRING PATTERN
71, 71B FIRST COVERLAY
713 OPENING
714 FIRST SECTION
715 SECOND SECTION
716 THIRD SECTION
72, 72B SECOND COVERLAY
3, 3B METAL REINFORCING PLATE
33 CONVEX PORTION
4, 4B, 4C SOLDER CONNECTION PORTION
40 SOLDER PASTE
8 COMMUNICATION PATH

The invention claimed is:

1. A wiring board assembly comprising:
a flexible printed wiring board comprising:
an insulating substrate comprising a first through-hole; and
a wiring pattern provided on the insulating substrate and extending to a peripheral edge of the first through-hole, wherein the wiring pattern comprises:
a first wiring pattern provided on a first main surface of the insulating substrate; and
a second wiring pattern provided on a second main surface of the insulating substrate;
a metal reinforcing plate attached to the flexible printed wiring board and facing the first through-hole, wherein the insulating substrate further comprises a second through-hole of which a second inner wall surface is not covered with the solder connection portion;
a communication path that communicates between the first through-hole and the second through-hole and that is interposed between the flexible printed wiring board and the metal reinforcing plate; and
a solder connection portion covering a first inner wall surface of the first through-hole and electrically connecting the first wiring pattern and the second wiring pattern to the metal reinforcing plate, wherein
the solder connection portion prevents the first through-hole and the second through-hole from communicating with each other via the communication path,
the metal reinforcing plate comprises a region that faces the first through hole and is partially exposed from the solder connection portion,
the insulating substrate, the first wiring pattern, and the second wiring pattern are exposed on the first inner wall surface, and
the solder connection portion contacts the exposed insulating substrate, the exposed first wiring pattern, and the exposed second wiring pattern that constitute the first inner wall surface.

2. The wiring board assembly according to claim 1, wherein
the flexible printed wiring board further includes a coverlay covering the first main surface and including an opening,
the opening includes
a first section facing the first through-hole and a peripheral edge portion of the first through-hole in the first wiring pattern,
a second section facing the second through-hole, and
a third section allowing the first section and the second section to communicate with each other,
the communication path is defined by the opening,
the metal reinforcing plate is attached to the coverlay, and
the solder connection portion electrically connects the first wiring pattern, the second wiring pattern, and the metal reinforcing plate to each other.

3. The wiring board assembly according to claim 1, wherein
the flexible printed wiring board further includes a coverlay covering the first main surface so that the first through-hole and a peripheral edge portion of the first through-hole in the first wiring pattern is exposed,
the metal reinforcing plate is attached to the coverlay, and
the solder connection portion electrically connects the first wiring pattern, the second wiring pattern, and the metal reinforcing plate to each other.

4. The wiring board assembly according to claim 1, wherein
the metal reinforcing plate includes a convex portion inserted into the first through-hole.

5. The wiring board assembly according to claim 1, wherein
the insulating substrate and the first wiring pattern are exposed on the second inner wall surface.

6. The wiring board assembly according to claim 1, wherein
the insulating substrate and the second wiring pattern are exposed on the second inner wall surface.

* * * * *